United States Patent
Tegen et al.

(10) Patent No.: US 12,439,636 B2
(45) Date of Patent: Oct. 7, 2025

(54) TRANSISTOR DEVICE

(71) Applicant: Infineon Technologies Austria AG, Villach (AT)

(72) Inventors: Stefan Tegen, Dresden (DE); Alessandro Ferrara, Landskron (AT); Franz Hirler, Isen (DE); Andrei Josiek, Dresden (DE); Matthias Kroenke, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 587 days.

(21) Appl. No.: 17/847,998

(22) Filed: Jun. 23, 2022

(65) Prior Publication Data
US 2023/0006059 A1 Jan. 5, 2023

(30) Foreign Application Priority Data

Jul. 1, 2021 (EP) .................................. 21183187

(51) Int. Cl.
| | |
|---|---|
| *H01L 29/06* | (2006.01) |
| *H01L 29/40* | (2006.01) |
| *H01L 29/78* | (2006.01) |
| *H10D 30/66* | (2025.01) |
| *H10D 62/10* | (2025.01) |
| *H10D 64/00* | (2025.01) |

(52) U.S. Cl.
CPC ......... *H10D 30/668* (2025.01); *H10D 62/103* (2025.01); *H10D 64/117* (2025.01)

(58) Field of Classification Search
CPC .................................................. H10D 12/415
See application file for complete search history.

(56) References Cited

U.S. PATENT DOCUMENTS 7,586,151 B2 * 9/2009 Takaya ................. H10D 30/665
257/341
7,638,841 B2 * 12/2009 Challa .................. H10D 84/146
257/341

(Continued)

FOREIGN PATENT DOCUMENTS

EP 2863417 A1 4/2015

OTHER PUBLICATIONS

"Influence of the Trench Corner Design on Edge Termination of UMOS Power Devices", Solid-State Electronics, Elsevier Science Publishers, Barking, GB, vol. 41, No. 12, 1997, pp. 1929-1936.

*Primary Examiner* — Dale E Page
(74) *Attorney, Agent, or Firm* — Murphy, Bilak & Homiller, PLLC

(57) ABSTRACT

A transistor device includes a semiconductor substrate having a first major surface, a cell field, and an edge termination region laterally surrounding the cell field. The cell field includes elongate trenches that extend from the first major surface into the semiconductor substrate and that are positioned substantially parallel to one another such that one or more inner elongate trenches are arranged between two outermost elongate trenches and elongate mesas, each elongate mesa being formed between neighbouring elongate trenches. The elongate mesas include a drift region, a body region on the drift region and a source region on the body region. In a top view, one or both of the outermost elongate trenches has a different contour from the one or more inner elongate trenches.

29 Claims, 8 Drawing Sheets

(56) References Cited

U.S. PATENT DOCUMENTS

| | | | | |
|---|---|---|---|---|
| 8,148,749 | B2* | 4/2012 | Grebs | H10D 8/051 |
| | | | | 438/270 |
| 8,466,492 | B1* | 6/2013 | Mauder | H10D 8/60 |
| | | | | 257/E29.015 |
| 9,064,897 | B2* | 6/2015 | Guan | H10D 62/157 |
| 9,129,822 | B2* | 9/2015 | Bhalla | H10D 62/393 |
| 9,337,298 | B2* | 5/2016 | Takeuchi | H10D 30/0297 |
| 9,806,186 | B2* | 10/2017 | Harrington, III | H10D 12/441 |
| 9,865,678 | B2* | 1/2018 | Bhalla | H10D 62/105 |
| 10,069,005 | B2* | 9/2018 | Guan | H10D 30/665 |
| 10,361,276 | B1* | 7/2019 | Seok | H10D 64/518 |
| 10,580,861 | B2* | 3/2020 | Dosev | H10D 62/126 |
| 2014/0027819 | A1* | 1/2014 | Guan | H10D 62/111 |
| | | | | 257/618 |
| 2015/0279985 | A1* | 10/2015 | Philippou | H10D 64/252 |
| | | | | 257/334 |
| 2015/0357461 | A1* | 12/2015 | Kawahara | H10D 64/519 |
| | | | | 257/329 |
| 2017/0263718 | A1* | 9/2017 | West | H01L 21/02164 |
| 2020/0111896 | A1* | 4/2020 | Feil | H10D 30/0297 |
| 2024/0136411 | A1* | 4/2024 | Lee | H10D 64/01 |
| 2024/0339507 | A1* | 10/2024 | Siemieniec | H10D 64/252 |
| 2024/0395926 | A1* | 11/2024 | Siemieniec | H10D 64/513 |

* cited by examiner

TRANSISTOR DEVICE

BACKGROUND

Transistor devices used in power electronic applications are often fabricated with silicon (Si) semiconductor materials. Common transistor devices for power applications include Si CoolMOS®, Si Power MOSFETs, and Si Insulated Gate Bipolar Transistors (IGBTs).

A transistor device for power applications may be based on the charge compensation principle and may include an active cell field including a plurality of trenches, each including a field plate for charge compensation. In some designs, the trenches and the mesas that are formed between adjacent trenches each have an elongate striped structure.

Typically, the active cell field of the transistor device is laterally surrounded by an edge termination structure which serves to avoid breakdown of the semiconductor device due to edge effects and to improve the performance of the device. US 2017/0263718 A1 discloses an edge termination structure surrounding a high-voltage MOSFET for reducing a peak lateral electric field. The edge termination structure includes a sequence of annular trenches and annular mesas circumscribing the high-voltage MOSFET, whereby each of the annular trenches is laterally separated from the other annular trenches by one of the annular semiconductor mesas.

However, further improvements would be desirable to further improve the performance of transistor devices, including MOSFET devices, to achieve a good on state resistance (RDS(on)) and a higher breakdown voltage.

SUMMARY

According to the invention, a transistor device is provided that comprises a semiconductor substrate having a first major surface, a cell field and an edge termination region laterally surrounding the cell field. The cell field comprises a plurality of elongate trenches that extend from the first major surface into the semiconductor substrate and that are positioned substantially parallel to one another such that one or more inner elongate trenches are arranged between two outermost elongate trenches. The cell field further comprises elongate mesas, each elongate mesa being formed between neighbouring elongate trenches. The elongate mesas comprise a drift region, a body region on the drift region and a source region on the body region. In a top view, one or both of the outermost elongate trenches has a different contour from the one or more inner elongate trenches.

In some embodiments, one or both of the outermost trenches has an outer corner facing towards the edge termination region and an inner corner facing towards an inner elongate trench. The inner trenches have first and second corners. In some embodiments, the outer corner of the outermost elongate trench has a different contour from the first and second corners of the one or more inner elongate trenches.

In some embodiments, one or both of the outermost trenches is asymmetrical with respect to a line of symmetry extending along the mid line of the length of the outermost trench.

The outermost trenches each have two ends, each end having an outer corner facing towards the edge termination region and an inner corner facing towards an inner elongate trench. The two outer corners may have a different contour from the inner corners and/or have a different contour from the first and second corners of the one or more inner elongate trenches.

In some embodiments, the edge termination region comprises an edge trench that extends from the first major surface into the semiconductor substrate and that laterally surrounds the cell field. The edge trench comprises longitudinal trench portions and transverse trench portions that extend between the longitudinal trench portions such that an inner trench corner is formed at each intersection between an inner side wall of one of the longitudinal trench portions and an inner side wall of one of the transverse trench portions. An edge mesa is formed between the edge trench and the cell field. The edge mesa also surrounds the cell field and the plurality of elongate trenches.

In some embodiments, the edge trench comprises two longitudinal trench portions and two transverse trench portions that extend between the longitudinal trench portions such that an inner trench corner is formed at each intersection between an inner side wall of the longitudinal trench portion and an inner side wall of the transverse trench portion. In this embodiment, the edge trench is substantially rectangular or square in plan view. In other embodiments, the edge trench comprises more than two longitudinal portions and more than two transverse portions, for example so as to have an indentation in plan view so that the edge trench extends laterally around two sides of a gate pad positioned in a corner of the semiconductor substrate or laterally around three sides of a gate pad that is positioned intermediate the length of semiconductor substrate. More broadly, the edge trench and the edge mesa both have a lateral continuous uninterrupted form and continuously and uninterruptedly laterally surround the cell field and the plurality of elongate trenches. The lateral form of the edge trench may be substantially concentric with the lateral contour of the cell field.

In some embodiments, the inner trench corner of the edge trench has a radius of curvature R that is greater than the width W of the edge mesa measured between the longitudinal trench portion and a longitudinal side wall of the outermost elongate trench and/or the inner trench corner of the edge trench has a radius of curvature R that is greater than the width $w_m$ of the elongate mesa.

In some embodiments, the inner trench corner of the edge trench has a radius of curvature R that is at least 10% greater than the width W of the edge mesa and, therefore, greater than any difference resulting from process variations.

In an alternative embodiment, a transistor device is provided that comprises a semiconductor substrate having a first major surface, a cell field and an edge termination region laterally surrounding the cell field. The cell field comprises a plurality of elongate trenches that extend from the first major surface into the semiconductor substrate and that are positioned substantially parallel to one another such that one or more inner elongate trenches are arranged between two outermost elongate trenches. The cell field further comprises elongate mesas, each mesa being formed between neighbouring elongate trenches. The elongate mesas comprise a drift region, a body region on the drift region and a source region on the body region. The edge termination region comprises an edge trench that extends from the first major surface into the semiconductor substrate and that surrounds the cell field, wherein the edge trench comprises longitudinal trench portions and transverse trench portions that extend between the longitudinal trench portions such that an inner trench corner is formed at each intersection between an inner side wall of the longitudinal trench portion and an inner side wall of the transverse trench portion. The inner trench corner of the edge trench has a radius of curvature R and an edge mesa is formed between the edge trench and the cell field. One or both of the outermost elongate trenches has an outer corner facing towards the edge termination region and an inner corner facing towards an inner elongate trench. A difference between a width $W_1$ of the edge mesa measured between the inner corner of the edge trench and the outer corner of the outermost elongate trench and a width W of the edge mesa measured between the longitudinal trench portion and a longitudinal side wall of the outermost elongate trench is less than 10%.

In a further implementation of this embodiment, and in a top view, one or both of the outermost elongate trenches has a different contour from the inner elongate trenches.

In a further implementation of this embodiment, the edge termination region comprises an edge trench that extends from the first major surface into the semiconductor substrate and that laterally surrounds the cell field. The edge trench comprises longitudinal trench portions and transverse trench portions that extend between the longitudinal trench portions such that an inner trench corner is formed at each intersection between an inner side wall of one of the longitudinal trench portions and an inner side wall of one of the transverse trench portions. An edge mesa is formed between the edge trench and the cell field. The edge mesa also surrounds the cell field and the plurality of elongate trenches.

In some embodiments, the edge trench comprises two longitudinal trench portions and two transverse trench portions that extend between the longitudinal trench portions such that an inner trench corner is formed at each intersection between an inner side wall of the longitudinal trench portion and an inner side wall of the transverse trench portion. In this embodiment, the edge trench is substantially rectangular or square in plan view. In other embodiments, the edge trench comprises more than two longitudinal portions and more than two transverse portions, for example so as to have an indentation in plan view so that the edge trench extends laterally around two sides of a gate pad positioned in a corner of the semiconductor substrate or laterally around three sides of a gate pad that is positioned intermediate the length of semiconductor substrate. More broadly, the edge trench and the edge mesa both have a lateral continuous uninterrupted form and continuously and uninterruptedly laterally surround the cell field and the plurality of elongate trenches. The lateral form of the edge trench may be substantially concentric with the lateral contour of the cell field.

In some embodiments, the outermost elongate trench has an outer corner facing towards the edge termination region and an inner corner facing towards an inner elongate trench, wherein the outer corner and the inner corner have a differing radius of curvature.

In some embodiments, the radius of curvature differs by at least 10% and by a greater amount than that resulting from processing variations.

In some embodiments, the outer corner of the outermost elongate trench has a radius of curvature $R_1$ that is greater than a radius of curvature $R_2$ of the inner corner.

In some embodiments, the radius of curvature $R_1$ is at least 10% greater than $R_2$ and differs by a greater amount than that resulting from processing variations.

In some embodiments, in plan view the corners of the inner elongate trenches have substantially the same radius of curvature, $R_3$. In some embodiments, $R_3$ varies by less than 5%.

In some embodiments, $R_1 > R_3$. In some embodiments, the difference between $R_1$ and $R_3$ is at least 10% and differs by a greater amount than that resulting from processing variations.

In some embodiments, $R_1 > R_2 > R_3$. In some embodiments, the difference between $R_1$ and $R_2$ and between $R_2$ and $R_3$ is at least 10% and differs by a greater amount than that resulting from processing variations.

In some embodiments, the radius of curvature R of the inner trench corner of the edge trench is at least 1 µm.

In some embodiments, the width W of the edge mesa lies in the range of 0.1 µm and 2 µm and/or each of the elongate trenches and the elongate mesas have a width that lies in the range of 0.1 µm and 2 µm.

In some embodiments, the width W of the edge mesa lies in the range of 0.2 µm and 2 µm and/or each of the elongate trenches and the elongate mesas have a width that lies in the range of 0.2 µm and 2 µm.

In some embodiments, the edge trench has a depth $d_T$ and the radius of curvature R of the inner trench corner of the edge trench is greater than the width W of the edge mesa at at least one position within the depth of the edge trench.

In an embodiment, the position at which the radius of curvature R of the inner trench corner of the edge trench is greater than the width W of the edge mesa is dT/2.

In some embodiments, the radius of curvature R of the inner trench corner of the edge trench is greater than the width W of the edge mesa over the entire depth $d_T$ of the edge trench.

In some embodiments, the transistor device further comprises at least one further cell field arranged laterally adjacent the cell field in the semiconductor substrate, the further cell field being surrounded by a further edge trench and a further edge mesa. The further cell field, further edge trench and further edge mesa may have the features of any one of the embodiments described herein. Each of the cell fields of the transistor device and its associated edge mesa and edge trench may have the same structure and may have the arrangement of any one of the embodiments described herein.

The transistor device may be a MOSFET or IGBT. The transistor device may include a trench gate or planar gate structure.

In some embodiments, the transistor device further comprises a field plate positioned in each elongate trench or some of the elongate trenches within the cell field.

In some embodiments, the transistor device further comprises elongate gate trenches that extend parallel to the elongate trenches. One elongate gate trench is positioned in some or all of the elongate mesas.

In other embodiments, the transistor device further comprises a planar gate positioned on one or more of the elongate mesas.

In some embodiments, the transistor device further comprises a gate electrode positioned in each elongate trench, or a gate electrode positioned in two or more of the elongate gate trenches.

In some embodiments, the transistor device further comprises a field plate positioned in some or all of the elongate trenches and agate electrode arranged above and electrically insulated from the field plate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1A:
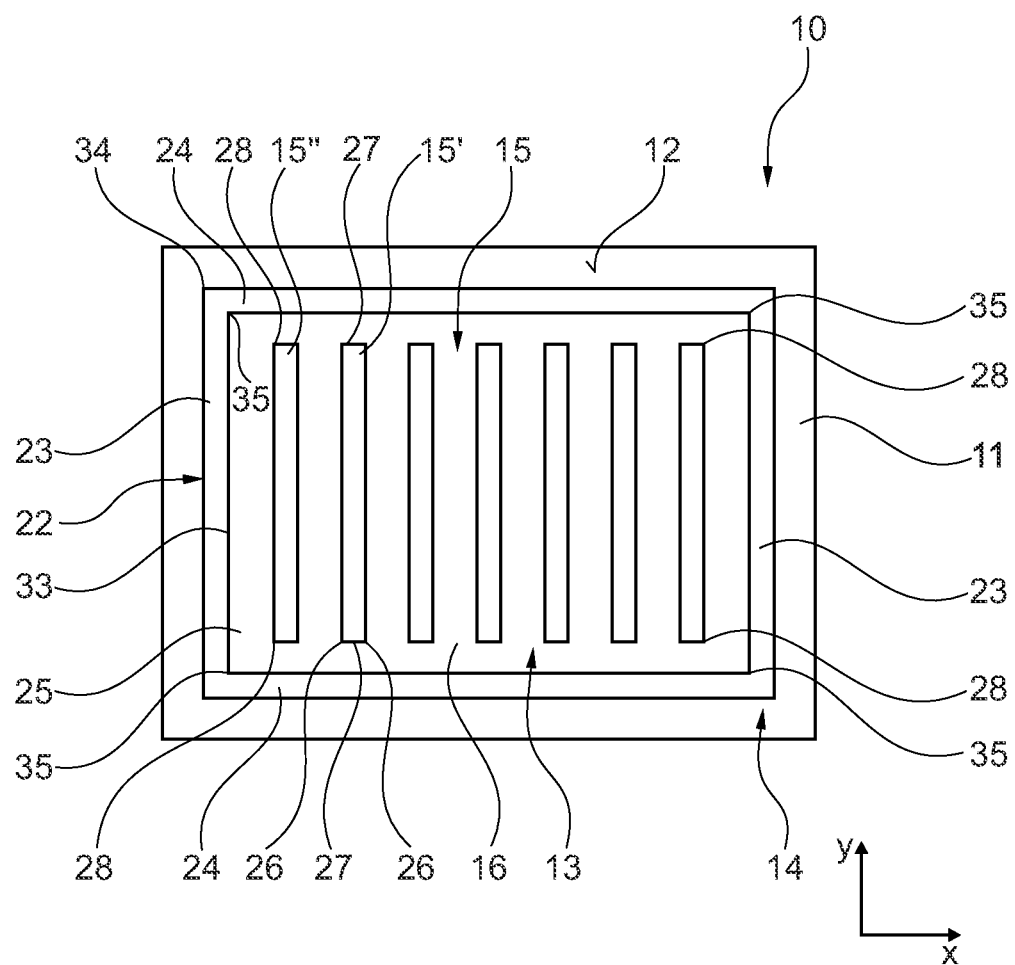
FIG. 1A illustrates a schematic plan view of a transistor device.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

A transistor device is optimized for switching applications and typically has a voltage rating indicating the voltage at which the transistor device may be safely operated. When the transistor device is off, it is capable of blocking a certain voltage, such as 100V, 120V or 150V, known as the blocking voltage or BVDSS for a particular drain source current (Ins). When the transistor device is on, it has a sufficiently low on-resistance (RON) for the application in which it is used, i.e., it experiences sufficiently low conduction loss when a substantial current passes through the device.

Some types of transistor device, such as a MOSFET, include a cell field comprising a plurality of substantially identical transistor cells, each having a transistor structure. The cells are electrically connected to form a single transistor device for switching. The cell field provides the active area of the transistor device within the semiconductor die in which the transistor device is formed. The transistor device includes an edge termination region that laterally surrounds the cell field and has a structure that serves to reduce the peak lateral electric field between the cell field and the side faces of the transistor device, i.e. the side faces of the semiconductor die, to avoid breakdown of the semiconductor device due to edge effects and to improve the performance of the device.

The edge termination region occupies part of the semiconductor die. Since the edge termination region does not contribute to the switching operation of the transistor device, it is desirable that the edge termination region does not occupy too much space so as to avoid increasing the lateral size of the die or having to decrease the size of the cell field and the active area for a given lateral size of the die.

The corner region of the transistor device and, in particular, the transition region between the active cell field and the edge termination region in the corner region of the transistor device can suffer from a lower breakdown voltage. Consequently, it is proposed herein to adopt measures to further optimise the design of the corner regions of the transistor device.

In some embodiments, the laterally outermost cells of the cell field have a different structure to the remainder of the cells of the cell field in order to avoid breakdown in the corner region. Alternatively, or in addition, the design of the corner region of the edge termination region is optimised in order to avoid breakdown in the corner region.

Various embodiments are provided herein in which one or both of the contour of the laterally outermost elongate trenches of the outermost transistor cell and the contour of the innermost edge trench of the edge termination region are formed so as to reduce the likelihood of breakdown in this region of the transistor device and to increase the breakdown voltage BVDSS of the transistor device.

Figure 1B:
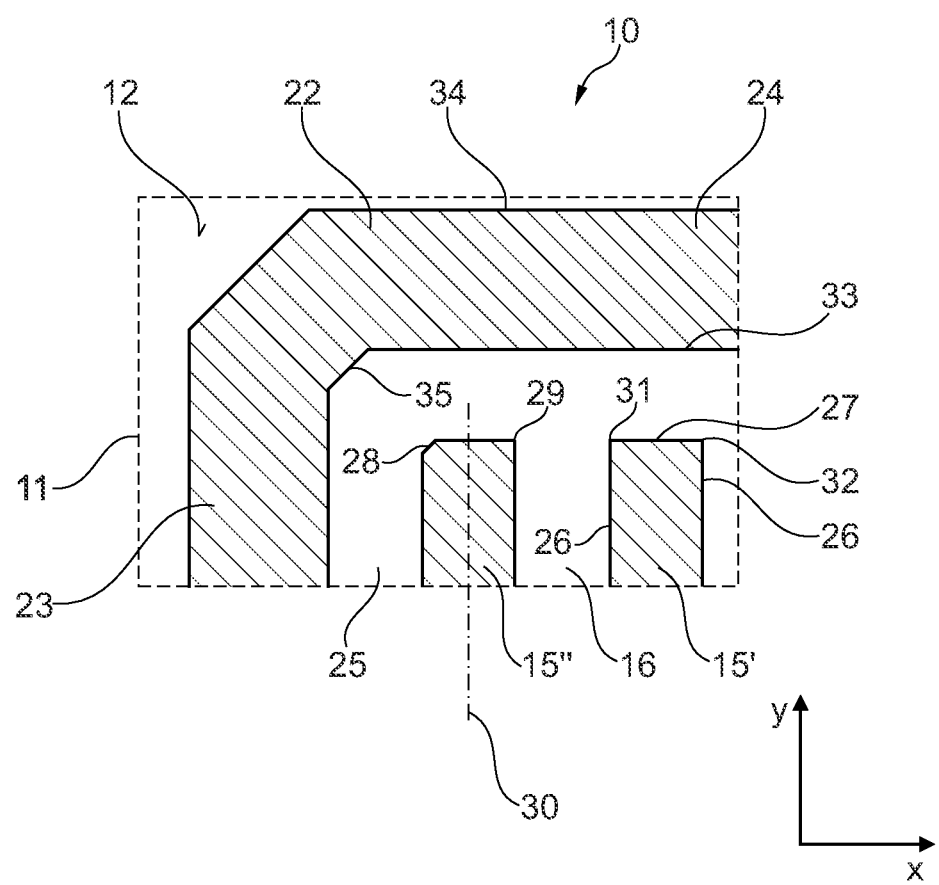
FIG. 1B illustrates an enlarged view of a corner region of the transistor device of FIG. 1A.
Figure 1C:
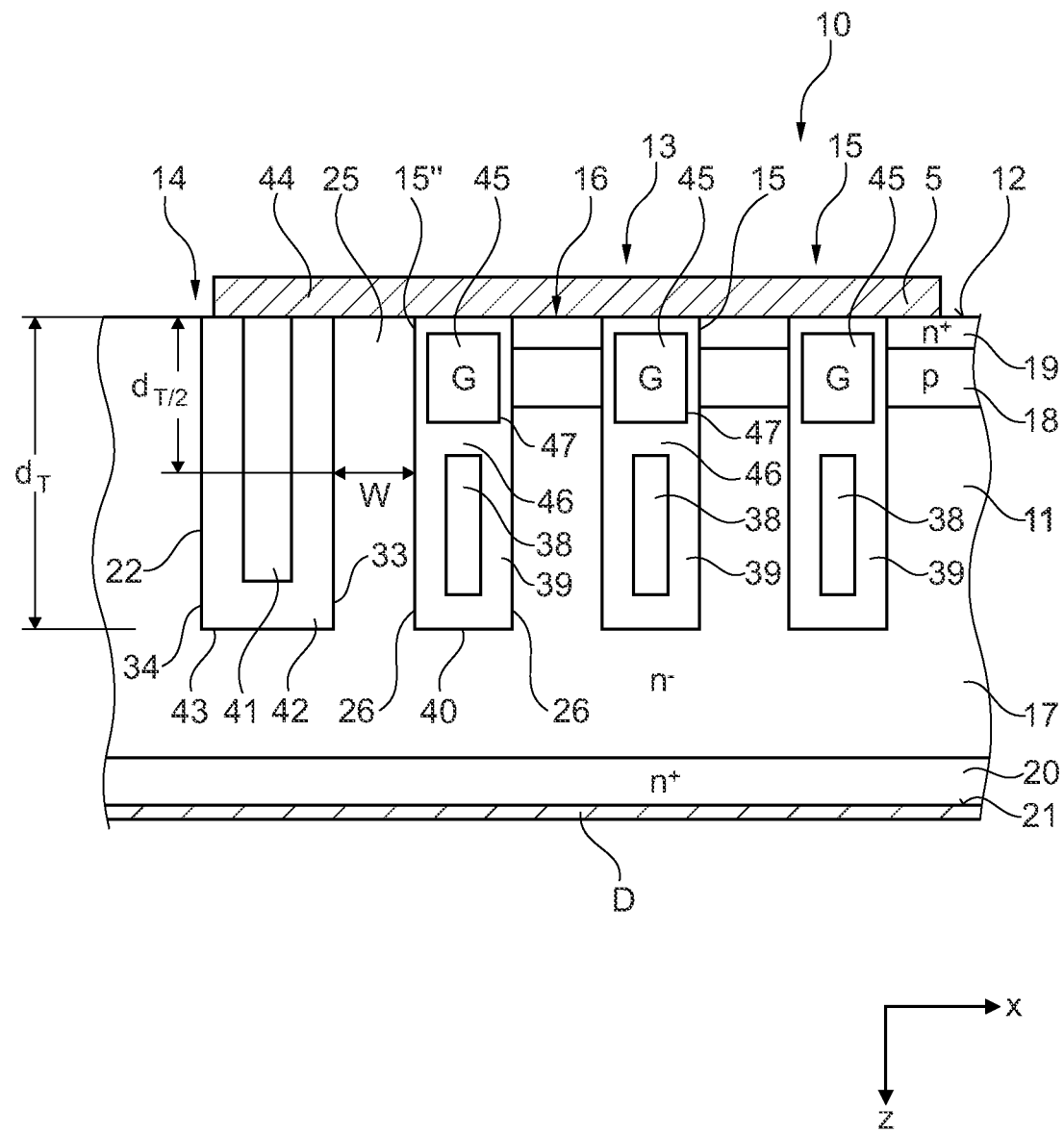
FIG. 1C illustrates a schematic cross-sectional view of the transistor device of FIG. 1A.

FIG. 1A illustrates a schematic plan view of a transistor device 10, FIG. 1B illustrates an enlarged view of a corner region of the transistor device 10 of FIG. 1A and FIG. 1C illustrates a cross-sectional view of the transistor device 10 of FIG. 1A.

The transistor device 10 comprises a semiconductor substrate 11 having a first major surface 12, a cell field 13 providing the active area of the transistor device 10 and an edge termination region 14 which laterally surrounds the cell field 13. Each of the cells of the cell field has a transistor structure. The cell field 13 comprises a plurality of elongate trenches 15 that extend from the major surface 12 into the semiconductor substrate 11. The elongate trenches 15 are positioned substantially parallel to one another such that one or more inner elongate trenches 15' are arranged between two outermost elongate trenches 15". The cell field 13 also comprises a plurality of elongate mesas 16, one elongate mesa 16 being formed between neighbouring ones of the elongate trenches 15. The elongate trenches 15 and the mesas 16 have a strip-like form that is longer than it is wide.

The semiconductor substrate 11 may be formed of monocrystalline silicon or epitaxially deposited silicon and may also be called a semiconductor die or semiconductor chip. The transistor device may be a Field Effect transistor device, such as a MOSFET device, whereby the term MOSFET is not limited to a metal oxide semiconductor FET, but also includes metal insulator semiconductor FETs. The gate of the transistor device may be formed of metal or of a highly doped semiconductor.

As can be seen in the cross-sectional view of FIG. 1C, the elongate mesas 16 comprise a drift region 17, a body region 18 on the drift region 17 and a source region 19 on the body region 18. The drift region 17 is of a first conductivity type, for example n-type, and the body region 18 is of a second conductivity type which opposes the first conductivity type, for example p-type if the drift zone is n-type. The source region 19 comprises the first conductivity type and is more highly doped than the drift region 17. The transistor device 10 also includes a highly doped drain region 20 of the first conductivity type at the rear surface 21 of the semiconductor substrate 11. The transistor device 10, therefore has a drift path extending between the front and rear surfaces 12, 21 and can be referred to as a vertical transistor device.

The edge termination region 14 comprises at least one edge trench 22 that extends from the first major surface 12 into the semiconductor substrate 11. The edge trench 22 laterally surrounds the cell field 13 and can be considered to have an annular form. In some embodiments, the edge trench 22 comprises two longitudinal trench portions 23 and two transverse trench portions 24 that extend between the longitudinal trench portions 23 to form a continuous annular edge trench 22. An edge mesa 25 is formed between the edge trench 22 and the cell field 13. The edge mesa 25 also has a continuous annular form.

In the Cartesian coordinate system, the longitudinal trench portions 23 extend in the y direction and the transverse trench portions 24 extend in the x direction. In an alternative view, the longitudinal trench portions 23 extend in the x direction and the transverse trench portions 24 extend in the y direction. More generally, the longitudinal and transverse portions 23, 24 may be considered first and second portions that are arranged substantially perpendicularly to one another to form an annular edge trench 22 that continuously and uninterruptedly laterally surrounds the cell field 13.

In a top view, one or both of the outermost elongate trenches 15" has a different contour from the one or more inner elongate trenches 15' as can be seen more easily in the enlarged top view of FIG. 1B. The contour of the outermost trenches 15" of the cell field 13 that contributes to the active switching of the transistor device 10 is adapted to reduce a peak in the electric field in the transition region between the cell field 13 and the edge termination region 14. In some embodiments, the contour of the outermost trenches 15" of the cell field 13 is adapted to reduce a peak in the electric field in the transition region between the cell field 13 and the edge termination region 14 in the corner region of the semiconductor substrate 11. Consequently, the edge termination structure is not exclusively positioned in the edge termination region but also in the cell field 13 itself, due to an adapted design of the outermost trench or trenches 15" of the cell field 13.

Each elongate trench 15 has two first or longitudinal sidewalls 26 which are connected by two second or transverse sidewalls 27 to form a strip-shaped trench that is longer than it is wide. The first and second side walls 26, 27 are arranged substantially perpendicularly to one another. Four corners are formed, each between a longitudinal side wall 26 and a transverse sidewall 27. In a top view, the contour of the trench 15 is formed by the shape of the longitudinal and transverse walls 26, 27.

Referring to FIG. 1B, the outermost trench 15" has an outer corner 28 which faces towards the edge termination region 14 and an inner corner 29 which faces towards an inner elongate trench 15'. In some embodiments, the outer corner 28 has a different contour from the inner corner 29. The outermost elongate trench 15" can be considered to have an asymmetrical contour with respect to a line of symmetry 30 extending along the midline of the length of the trench 15". The contour of the outermost trench 15" is designed to i.e., reduce a peak in the electric field in the transition region between the cell field 13 and the edge termination region 14 in the corner region of the semiconductor substrate 11.

Each of the inner elongate trenches 15' also has second transverse trench walls 27 extending between two first longitudinal trench walls 26 so as to form first and second corners 31, 32 between the opposing ends of the transverse sidewalls 27 and the longitudinal walls 26 forming the inner elongate trench 15'. In the schematic view of FIG. 1A, the corners 31, 32 of the inner elongate trenches 15' are illustrated as having an angle of approximately 90° with the transverse sidewalls 27 being perpendicular to the longitudinal sidewalls 26. However, in practice, these corners 31, 32 are typically slightly rounded due to manufacturing process.

In some embodiments, the outer corner 28 of the outermost elongate trench 15" has different contour from the first and second corners 31, 32 of the one or more inner elongate trenches 15' as well has having a different contour from the inner corner 29.

In some embodiments, the second outermost elongate trench 15" at the opposing side of the cell field 13 has substantially the same arrangement with respect to the edge trench 22 and inner elongate trenches 15' so that its outer corner 28' that faces towards the edge trench 22 and in the opposing direction to the outer corner 28 seen in the partial view of FIG. 1B. The outer corner 28' has different contour from the inner corner 29 and from the first and second corners 31, 32 of the one or more inner elongate trenches 15'.

The edge trench 22 has an inner side wall 33 and an outer side wall 34 that is spaced apart from the inner side wall 33 so as to define the width of the edge trench 22. The inner sidewall 33 is considered to be the sidewall which is laterally positioned closer to the cell field 13. An inner trench corner 35 is formed at each intersection between an inner sidewall 33 of the longitudinal trench portion 23 and an inner sidewall 33 of the transverse trench portion 24.

Figure 2:
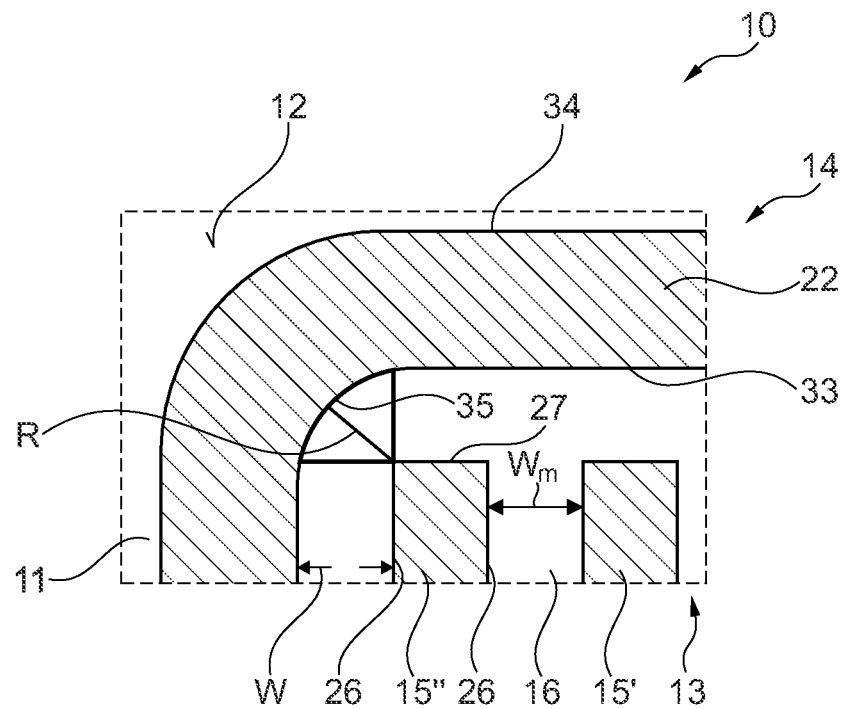
FIG. 2 illustrates a schematic plan view of a portion of a transistor device according to an embodiment.

FIG. 2 illustrates a plan view of a transistor device 10 according to an embodiment, in which the design of the corner region includes a modification to the edge trench 22. Referring to FIG. 2, the inner trench corner 35 of the edge trench 22 has a radius of curvature R which is greater than the width W of the edge mesa 25 measured at a position between the longitudinal trench portion 23 and the longitudinal sidewall 26 of the outermost elongate trench 15". It has been found that by having a radius of curvature R of the inner corner 35 of the edge trench 22 which is greater than the width W of the edge mesa 25 measured at a position between the longitudinal trench portion 23 and the longitudinal sidewall 26 of the outermost elongate trench 15" the peak electric field in the corner region can be reduced.

Alternatively, or in addition, the inner corner 35 of the edge trench 22 has a radius of curvature R that is greater than the width $w_m$ of the elongate mesa 16 formed between the outermost elongate trench 15" and the next adjacent inner trench 15'.

In some embodiments, the radius of curvature R of the inner corner 35 of the edge trench 22 is at least 10% greater than the width W of the edge mesa 25. The difference is therefore greater than the variations in the critical dimensions resulting from the manufacturing processes.

Figure 3:
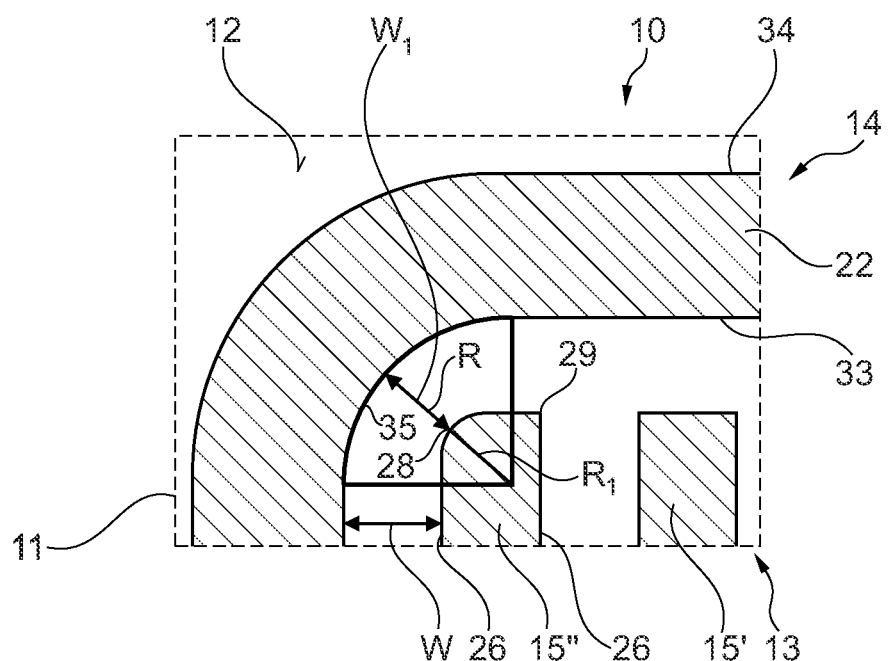
FIG. 3 illustrates a schematic plan view of a portion of the transistor device according to an embodiment.

FIG. 3 illustrates a plan view of a transistor device 10 according to an embodiment, in which not only the radius of curvature R of the inner corner 35 of the edge trench 22 but also the outer corner 28 of the outermost elongate trench 15" is optimised. In some embodiments, the radius $R_1$ of the outer corner 28 is optimised. The edge mesa 25 has a width W1 at a position measured between the inner corner 35 of the edge trench 22 and the outer corner 28 of the outermost elongate 15" and a width W at a position measured between the inner wall 33 of the longitudinal trench portion 23 of the edge trench 22 and the longitudinal wall 26 of the outermost trench 15". The breakdown voltage in the corner region can be increased by having the widths W1 and W be as similar and as possible, for example, the difference between the width W1 and the width W should be less than 10%, or less than 5%.

Figure 5:
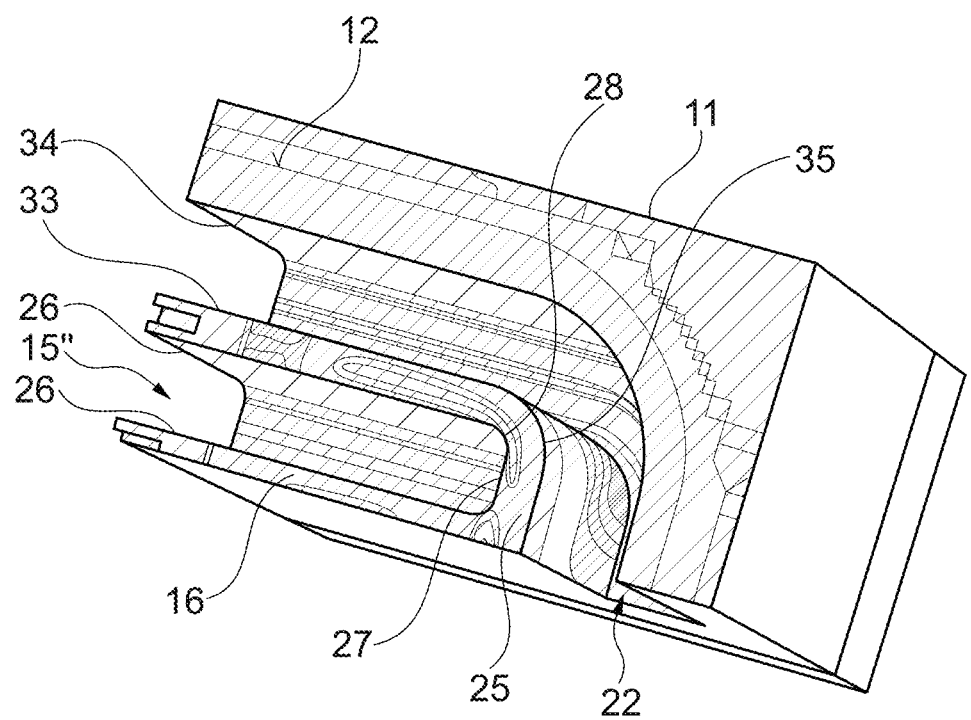
FIG. 5 illustrates a perspective view of a portion of a transistor device according to an embodiment.

The corner region of the transistor device 10 and, in particular, the region between the inner corner 35 of the annular edge trench 22 and the outer corner 28 of the outermost elongate trenches 15" of the cell field 13, as indicated in the perspective view of FIG. 5 with an arrow, has been observed to suffer from a lower breakdown voltage than expected. Various embodiments are provided herein in which the contour of the outermost elongate trench 15" and the contour of the edge trench 22 are formed so as to reduce the likelihood of breakdown in this region of the transistor device and to increase the breakdown voltage.

Various embodiments are provided herein in which the contour of the outermost elongate trench 15" and the contour of the edge trench 22 are formed so as to reduce the difference between the width W1 and the width W and to provide an edge mesa 29 which has a width which is as uniform as possible. This difference between the side W1 and width W is reduced by selecting a suitable radius of curvature for one or both of the inner corner 35 of the edge trench 22 and the outer corner 28 of the outermost elongate trench 15".

Figure 4:
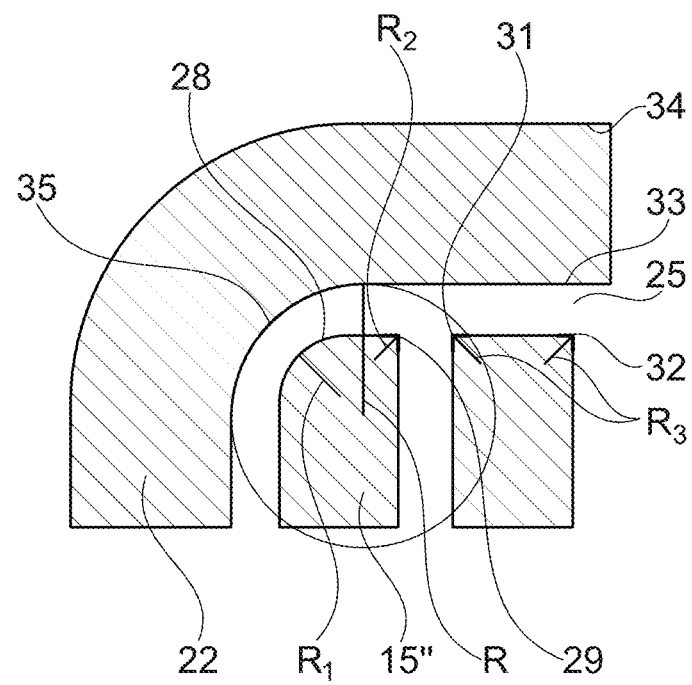
FIG. 4 illustrates a schematic plan view of a portion of a transistor device according to an embodiment

FIG. 4 illustrates a top view and FIG. 5 a perspective view of a portion of a transistor device 10 in which the outermost elongate trench 15" has an outer corner 28 having a radius of curvature R1 and an inner corner 29 having a radius of curvature R2. In some embodiments, the radius of curvature R1 is greater than the radius of curvature R2. In these embodiments, the outermost elongate trench 15" is asymmetric about a line of symmetry 30 extending along the midline of the length of the outermost elongate trench 15".

In some embodiments, in addition, the contour of the outermost elongate trench 15" differs from the contour of one, some or all of the inner trenches 15' of the plurality of trenches 15 in the active switching area provided by the cell field 13. The outermost trenches 15" and some or the inner trenches 15' may not form part of the switching area. In these embodiments, the corners 31, 32 of the inner elongate trenches 15' typically have substantially the same radius of curvature R3. Typically, the radius of curvature R3 is less than the radius of curvature R1 of the outer corner 28 of the outermost elongate trench 15".

In some embodiments, the radius of curvature R1 of the outer corner 28 of the outermost elongate trench 15" is greater than the radius of curvature R2 of the inner corner 29 of the outermost elongate trench 15" and radius of curvature R2 is greater than the radius of curvature R3 of the corners 31, 32 of the inner elongate trenches 15'.

Typically, the side walls of the edge trench 22 as well as the side walls of the elongate trenches 15 do not extends exactly perpendicularly to the first surface 12 into the semiconductor substrate 1. Due to the etching process used to form the edge trench 22 and elongate trenches 25, the edge trench 22 and elongate trenches 25 commonly have a slightly tapered form such that the width of the edge trench 22 and elongate trenches 15 is greater when measured at a position at the first major surface 12 than at the base of the respective trench.

The edge trench 22 has a depth $d_T$ as indicated in the cross-sectional view of FIG. 1C. The radius of curvature R of the inner trench corner 35 of the edge trench 22 is greater than the width W of the edge mesa at least one position within the depth $d_T$ of the trench.

In some embodiments, the position within the depth $d_T$ of the edge trench 22 in which the radius of curvature of the inner trench corner 35 of the edge trench 22 is greater than the width W of the edge mesa 25 is measured at a position of half of the depth of the edge trench, that is $d_T/2$. In some embodiments, the radius of curvature R of the inner trench corner 36 of the edge trench 22 is greater than the width W of the edge mesa 25 over the entire depth $d_T$ of the edge trench 22.

Figure 6:
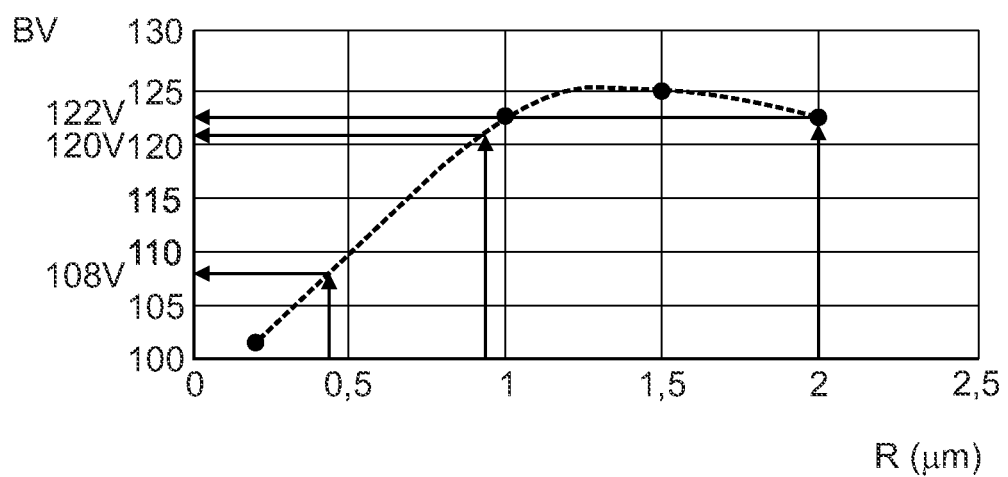
FIG. 6 illustrates a graph of breakdown voltage calculated for different radii of curvature of a trench in the edge termination region.

FIG. 6 illustrates a graph of breakdown voltage (BV) calculated for different radii of curvature R of the inner corner 35 of the edge trench 22 for a particular transistor device. It can be seen that the breakdown voltage increases as the radius of curvature R is increased and that there is a maximum in the curve for a radius of curvature R of around 0.9 µm to 2 µm, for this design of transistor device. As examples, the radius of curvature R of the inner trench corner 35 of the edge trench 22 is at least 1 µm. The width W of the edge mesa 25 may lie within the range of 0.1 µm to 2 µm, or 0.2 µm to 2 µm, and each of the elongate trenches 15 and the elongate mesas 16 has a width that lies in the range of 0.1 µm to 2 µm, or 0.2 µm to 2 µm.

Figure 7:
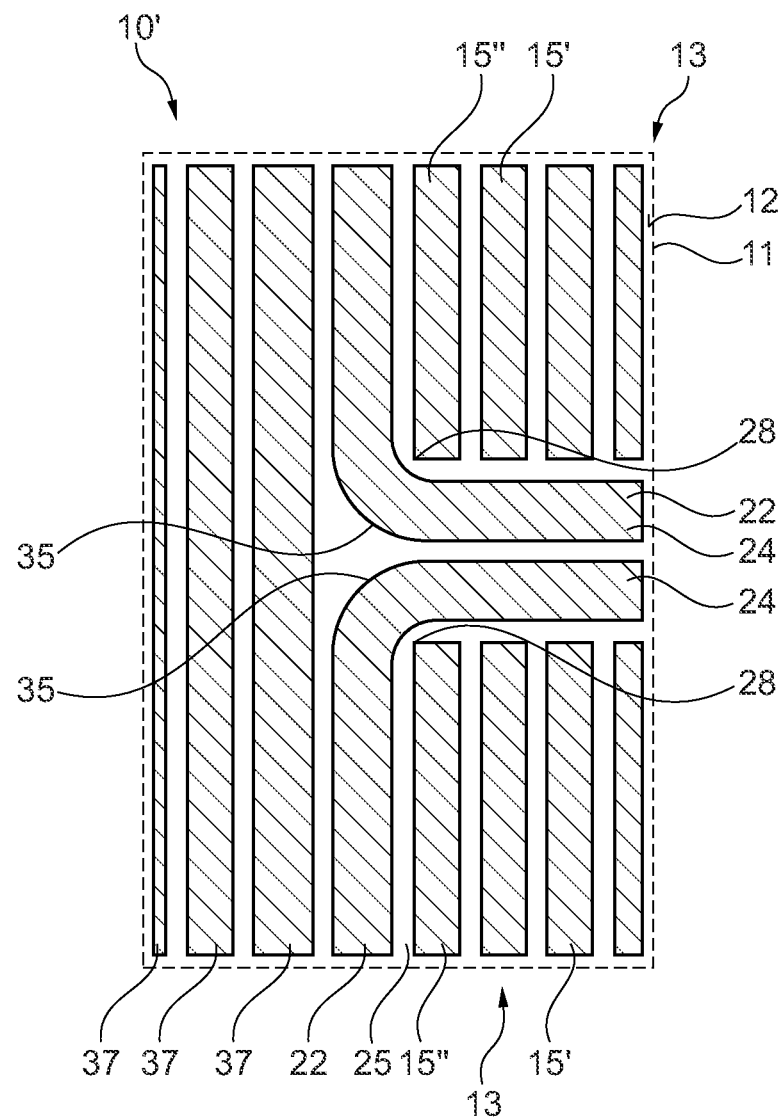
FIG. 7 illustrates a schematic plan view of a portion of a transistor device according to an embodiment with two or more cell fields.

FIG. 7 illustrates a schematic top view of a portion of a semiconductor device 10 prime according to a further embodiment. The transistor device 10' comprises two or more cell fields 13 each of which is laterally surrounded by an edge trench 22. Each cell field 13 comprises a plurality of elongate trenches 15 with two outermost elongate trenches 15" being positioned on opposing sides of one or more inner elongate trenches 15'. The plurality of trenches 15 and associated mesas 16 forms a cell field 13 that is laterally surrounded by an edge trench 22.

Since each cell field 13 is laterally surrounded by an edge trench 22, two portions, e.g. transverse portions 24, of two edge trenches 22 are positioned between two cell fields 13. The edge termination region 14 may include one or more further edge trenches 37 which also have a generally annular form and which laterally surround and enclose all of the two or more cell fields 13 and the outer portions of the edge trenches 22 of each cell field 13. The outermost elongate trenches 15" of each cell field 13 may have a contour which differs from the inner elongate trenches 15' for example, and/or the inner corner 35 of the edge trench 22 of each cell field 13 may have a contour or radius according to any one of the embodiments described herein.

The various arrangements of the edge trench 22, edge mesa 25 and elongate trenches 15 may be used for transistor devices having various transistor structures.

In some embodiments, such as that illustrated in FIG. 1C, the plurality of elongate trenches 15 of the cell field 13 that provides the active portion of the transistor device 10 include an electrically conductive field plate 38 positioned in each elongate trench 15 which is electrically insulated from the semiconductor substrate 11 by dielectric material 39 which lines the sidewalls 26, 27 and base 40 of the elongate trenches 15. The edge trench 22 may also include an electrically conductive field plate 41 which may have a continuous annular shape in plan view. The edge field plate 41 is also electrically insulated from the semiconductor substrate 11 by a dielectric layer 42 which lines the sidewalls 33, 34 and base 43 of the edge trench 22. The edge field plate 41 may extend to the front surface 12 of the semiconductor substrate 11 and be electrically coupled to source potential, for example by a metallisation layer 44 positioned on the front surface 12 which extends from the edge field plate 41 to the n+-doped source regions 19.

In some embodiments, the transistor device 10 has a gate trench structure in which the gate electrode 45 is positioned in the elongate trenches 15 in the cell field 13 which form part of the switching area of the transistor device 10. In some embodiments, the gate electrode 45 is positioned in each of the elongate trenches 15. In some embodiments, the gate electrode 45 is omitted from some of the elongate trenches 15 so that these elongate trenches include only a field plate or a field plate and some other structure on top of the field plate.

Referring to FIG. 1C, in some embodiments, the gate electrode 45 is positioned in the elongate trenches 15 above the field plate 38 in the elongate trenches 15. The gate electrode is electrically insulated from the field plate 38 by an intervening dielectric layer 46 and is electrically insulated from the semiconductor substrate 11 by a dielectric layer 47 which lines the sidewalls 26, 27 of the elongate trenches 15 in the upper portion. The dielectric layer 47 is typically thinner than the dielectric layer 39 insulating the field plate 38 from the semiconductor substrate 11 and forms the gate oxide of the MOSFET structure.

Figure 8A:
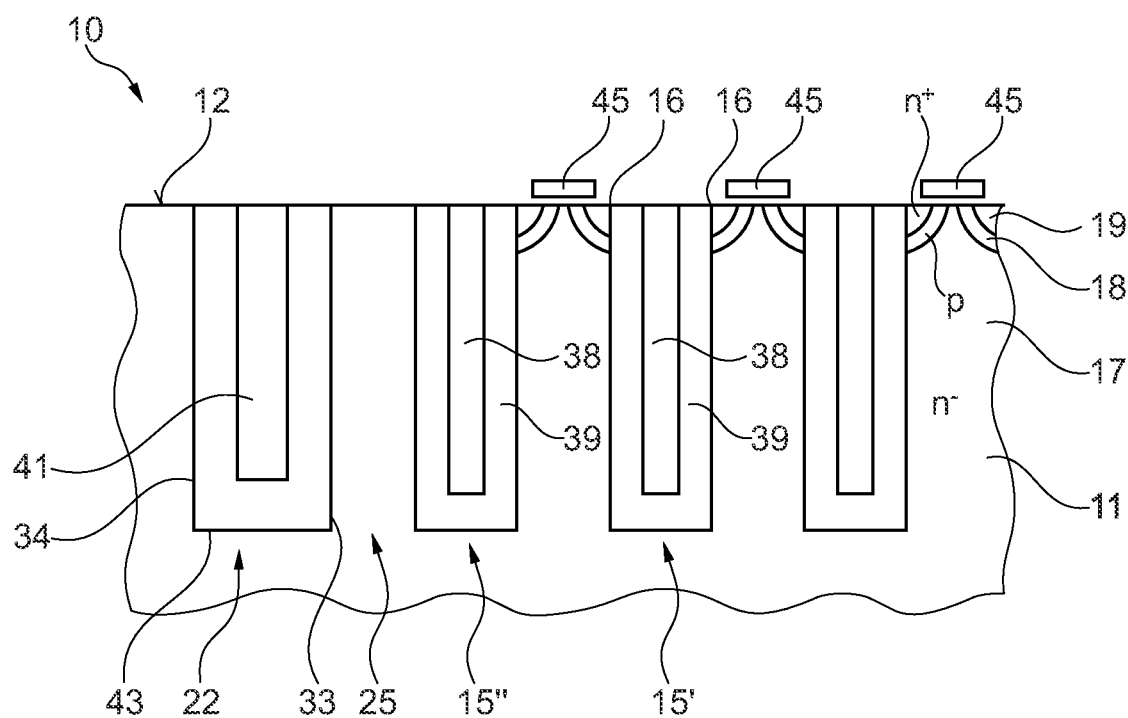
FIG. 8A illustrates a schematic cross-sectional view of a transistor device according to an embodiment which has a planar gate structure.

In other embodiments, such as that illustrated in FIG. 8A, the transistor device 10 has a planar gate structure in which each of the elongate trenches 15 includes a field plate 38 which extends to or nearly to the front surface 12 of the semiconductor substrate 11. The gate electrode 45 is positioned on the front surface 12 of the semiconductor substrate 11 on the mesas 16. In these embodiments, the body region 18 and source region 19 have the form of wells positioned on each side of the elongate trenches 15.

Figure 8B:
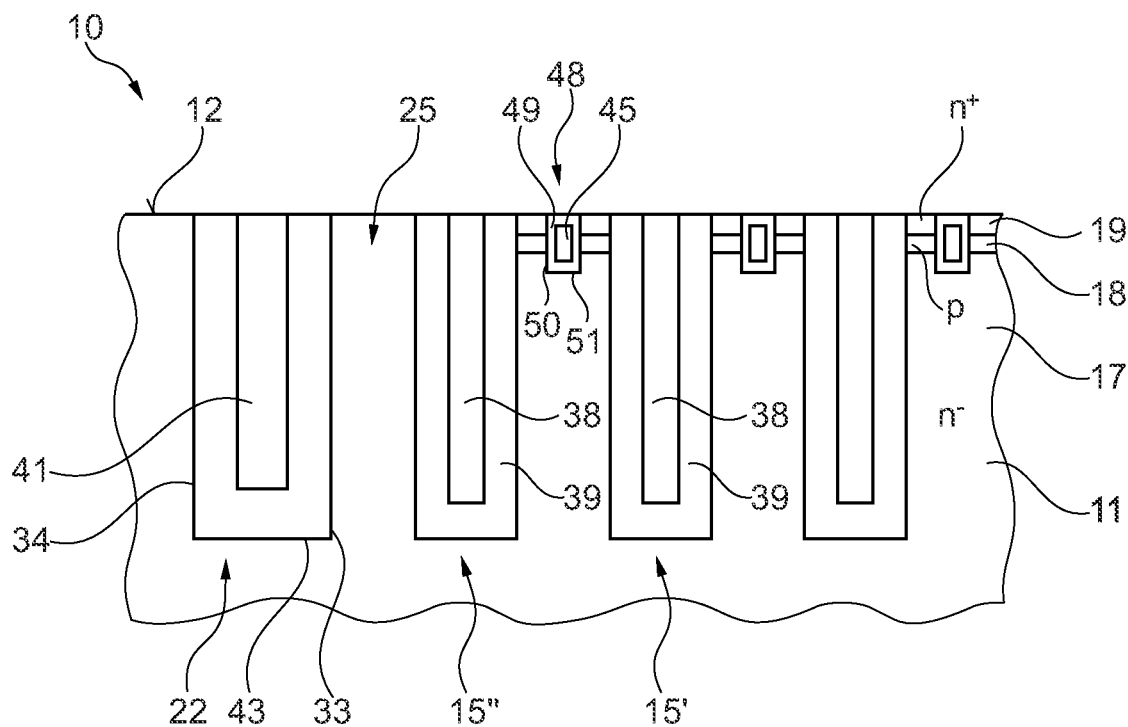
FIG. 8B illustrates a schematic cross-sectional view of a transistor device according to an embodiment which has a trench gate structure.

In some embodiments, such as that illustrated in FIG. 8B, the gate electrode 45 is positioned in a further gate trench 48 that is separate from the elongate trenches 15. The gate trench 48 which is positioned in the mesa 16 between two elongate trenches 15 which comprise a field plate 38. The gate trench 48 has an elongate form such that it extends substantially parallel to the elongate trenches 15. The gate trench 48 has a depth which is less than the depth of the elongate trenches 15. The gate trench 48 is lined with dielectric material 49 on its side walls 50, which forms the gate oxide of the MOSFET, and on its base 51.

In some embodiments, the gate electrode 45 is positioned in two or more elongate trenches 15 and has a racetrack design.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A transistor device, comprising:
a semiconductor substrate having a first major surface, a cell field, and an edge termination region laterally surrounding the cell field, wherein the cell field comprises:

a plurality of elongate trenches that extend from the first major surface into the semiconductor substrate and that are positioned substantially parallel to one another such that one or more inner elongate trenches are arranged between two outermost elongate trenches; and elongate mesas, each elongate mesa being formed between neighbouring elongate trenches, wherein the elongate mesas comprise a drift region, a body region on the drift region and a source region on the body region, wherein in a top view, one or both of the outermost elongate trenches has a different contour from the one or more inner elongate trenches, wherein the edge termination region comprises an edge trench that extends from the first major surface into the semiconductor substrate and that laterally surrounds the cell field, wherein the edge trench comprises longitudinal trench portions and transverse trench portions that extend between the longitudinal trench portions such that an inner trench corner is formed at each intersection between an inner side wall of the longitudinal trench portion and an inner side wall of the transverse trench portion, wherein an edge mesa is formed between the edge trench and the cell field, and wherein the inner trench corner of the edge trench has a radius of curvature that is greater than the width of the edge mesa measured between the longitudinal trench portion and a longitudinal side wall of the outermost elongate trench and/or the inner trench corner of the edge trench has a radius of curvature that is greater than the width of the elongate mesa.

2. The transistor device of claim 1, wherein the radius of curvature of the inner trench corner of the edge trench is at least 1 μm.

3. The transistor device of claim 1, wherein the width of the edge mesa lies in a range of 0.1 μm and 2 μm and/or the elongate trenches and the elongate mesas have a width that lies in a range of 0.1 μm and 2 μm.

4. The transistor device of claim 1, wherein the outermost elongate trench has an outer corner facing towards the edge termination region and an inner corner facing towards an inner elongate trench, and wherein the outer corner and the inner corner have a differing radius of curvature.

5. The transistor device of claim 4, wherein the outer corner has a radius of curvature $R_1$ that is greater than a radius of curvature $R_2$ of the inner corner.

6. The transistor device of claim 5, wherein in plan view, the corners of the inner elongate trenches have substantially a same radius of curvature $R_3$.

7. The transistor device of claim 6, wherein $R_1 > R_3$.

8. The transistor device of claim 6, wherein $R_1 > R_2 > R_3$.

9. The transistor device of claim 1, further comprising a further active cell field arranged laterally adjacent the cell field in the semiconductor substrate, wherein the further active cell field is surrounded by a further edge trench and a further edge mesa.

10. The transistor device of claim 1, further comprising a field plate positioned in each elongate trench.

11. The transistor device of claim 10, further comprising elongate gate trenches that extend parallel to the elongate trenches and comprising a gate electrode, or a planar gate electrode positioned on one or more of the elongate mesas.

12. The transistor device of claim 1, further comprising a gate electrode positioned in each elongate trench, or a gate electrode positioned in two or more of the elongate gate trenches.

13. The transistor device of claim 1, further comprising a gate electrode arranged above and electrically insulated from a field plate.

14. A transistor device, comprising:
a semiconductor substrate having a first major surface, a cell field, and an edge termination region laterally surrounding the cell field, wherein the cell field comprises:
a plurality of elongate trenches that extend from the first major surface into the semiconductor substrate and that are positioned substantially parallel to one another such that one or more inner elongate trenches are arranged between two outermost elongate trenches;

elongate mesas, each elongate mesa being formed between neighbouring elongate trenches, wherein the elongate mesas comprise a drift region, a body region on the drift region and a source region on the body region;

wherein the edge termination region comprises an edge trench that extends from the first major surface into the semiconductor substrate and that laterally surrounds the cell field, wherein the edge trench comprises longitudinal trench portions and transverse trench portions that extend between the longitudinal trench portions such that an inner trench corner is formed at each intersection between an inner side wall of the longitudinal trench portion and an inner side wall of the transverse trench portion, wherein the inner trench corner of the edge trench has a radius of curvature and wherein an edge mesa is formed between the edge trench and the cell field, wherein one or both of the outermost elongate trenches has an outer corner facing towards the edge termination region and an inner corner facing towards an inner elongate trench, wherein a difference between a width of the edge mesa measured between the inner corner of the edge trench and the outer corner of the outermost elongate trench and a width of the edge mesa measured between the longitudinal trench portion and a longitudinal side wall of the outermost elongate trench is less than 10%, wherein the outermost elongate trench has an outer corner facing towards the edge termination region and an inner corner facing towards an inner elongate trench, wherein the outer corner and the inner corner have a differing radius of curvature.

15. The transistor device of claim 14, wherein the outer corner has a radius of curvature $R_1$ that is greater than a radius of curvature $R_2$ of the inner corner.

16. The transistor device of claim 15, wherein in plan view, the corners of the inner elongate trenches have substantially a same radius of curvature $R_3$.

17. The transistor device of claim 16, wherein $R_1 > R_3$.

18. The transistor device of claim 16, wherein $R_1 > R_2 > R_3$.

19. The transistor device of claim 14, further comprising a further active cell field arranged laterally adjacent the cell field in the semiconductor substrate, wherein the further active cell field is surrounded by a further edge trench and a further edge mesa.

20. The transistor device of claim 14, further comprising a field plate positioned in each elongate trench.

21. The transistor device of claim 20, further comprising elongate gate trenches that extend parallel to the elongate trenches and comprising a gate electrode, or a planar gate electrode positioned on one or more of the elongate mesas.

22. The transistor device of claim 14, further comprising a gate electrode positioned in each elongate trench, or a gate electrode positioned in two or more of the elongate gate trenches.

23. The transistor device of claim 14, further comprising a gate electrode arranged above and electrically insulated from a field plate.

24. The transistor device of claim 14, wherein in a top view, one or both of the outermost elongate trenches has a different contour from the inner elongate trenches.

25. A transistor device, comprising:
   a semiconductor substrate having a first major surface, a cell field, and an edge termination region laterally surrounding the cell field, wherein the cell field comprises:
      a plurality of elongate trenches that extend from the first major surface into the semiconductor substrate and that are positioned substantially parallel to one another such that one or more inner elongate trenches are arranged between two outermost elongate trenches; and
      elongate mesas, each elongate mesa being formed between neighbouring elongate trenches, wherein the elongate mesas comprise a drift region, a body region on the drift region and a source region on the body region,
   wherein in a top view, one or both of the outermost elongate trenches has a different contour from the one or more inner elongate trenches,
   wherein the outermost elongate trench has an outer corner facing towards the edge termination region and an inner corner facing towards an inner elongate trench,
   wherein the outer corner and the inner corner have a differing radius of curvature.

26. The transistor device of claim 25, wherein the outer corner has a radius of curvature $R_1$ that is greater than a radius of curvature $R_2$ of the inner corner.

27. The transistor device of claim 26, wherein in plan view, the corners of the inner elongate trenches have substantially a same radius of curvature $R_3$.

28. The transistor device of claim 27, wherein $R_1 > R_3$.

29. The transistor device of claim 27, wherein $R_1 > R_2 > R_3$.

* * * * *